United States Patent
Watari et al.

(10) Patent No.: US 10,276,517 B2
(45) Date of Patent: Apr. 30, 2019

(54) SEMICONDUCTOR DEVICE (71) Applicant: Toshiba Memory Corporation, Tokyo (JP)

(72) Inventors: Gen Watari, Chigasaki Kanagawa (JP); Masato Sugita, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,968

(22) Filed: Sep. 4, 2017

(65) Prior Publication Data
US 2018/0277498 A1    Sep. 27, 2018

(30) Foreign Application Priority Data

Mar. 27, 2017 (JP) ................................ 2017-061444

(51) Int. Cl.
| | |
|---|---|
| *H01L 21/50* | (2006.01) |
| *H01L 21/00* | (2006.01) |
| *H01L 23/552* | (2006.01) |
| *H01Q 1/52* | (2006.01) |
| *H01L 23/60* | (2006.01) |
| *H01L 25/18* | (2006.01) |
| *H01L 23/528* | (2006.01) |
| *H01L 23/498* | (2006.01) |

(52) U.S. Cl.
CPC .......... *H01L 23/60* (2013.01); *H01L 23/5286* (2013.01); *H01L 25/18* (2013.01); *H01L 23/49816* (2013.01)

(58) Field of Classification Search
CPC ...... H01L 23/60; H01L 23/5286; H01L 25/18
USPC .............. 257/723, 738, 741, 774, 659, 692, 257/E23.023, E23.062, E23.068, E23.069, 257/E25.01, E25.023, E21.502, E21.505, 257/E21.511, E21.599; 361/760, 818; 438/106, 113, 612
See application file for complete search history.

(56) References Cited

U.S. PATENT DOCUMENTS

| | | | |
|---|---|---|---|
| 5,590,042 A | 12/1996 | Allen, Jr. et al. | |
| 8,716,873 B2 * | 5/2014 | Wang | .................. H01L 21/4832 257/690 |

(Continued)

FOREIGN PATENT DOCUMENTS

JP     5590042 B2    9/2014

*Primary Examiner* — Dao H Nguyen
(74) *Attorney, Agent, or Firm* — Kim & Stewart LLP (57) ABSTRACT

A semiconductor device includes a mounting substrate including an interface, which is connectable with a host, and a first ground layer, a surface-mounted component mounted on the mounting substrate, and a plurality of solder balls between the mounting substrate and the surface-mounted component. The surface-mounted component includes a semiconductor chip, a package substrate that is positioned between the semiconductor chip and the solder balls and includes a second ground layer, a sealing portion that covers the semiconductor chip, and has an opening, a first conductive portion on a top surface of the sealing portion, and a second conductive portion on a side surface of the opening and electrically connected to the first conductive portion and the second ground layer. The second ground layer is electrically connected to the first ground layer through one of the solder balls.

20 Claims, 7 Drawing Sheets

(56) References Cited

U.S. PATENT DOCUMENTS

| | | | | |
|---|---|---|---|---|
| 9,030,841 | B2* | 5/2015 | Arnold | H01L 23/552 361/818 |
| 2004/0180525 | A1* | 9/2004 | Shim | H01L 23/4334 438/612 |
| 2010/0140759 | A1* | 6/2010 | Pagaila | H01L 21/565 257/660 |
| 2012/0062439 | A1* | 3/2012 | Liao | H01L 23/481 343/841 |
| 2012/0086109 | A1* | 4/2012 | Kim | H01L 21/561 257/659 |
| 2014/0028518 | A1* | 1/2014 | Arnold | H01Q 1/526 343/841 |

* cited by examiner

SEMICONDUCTOR DEVICE

This application is based upon and claims the benefit of priority from Japanese Patent Application No. 2017-061444, filed Mar. 27, 2017, the entire contents of which are incorporated herein by reference.

FIELD

Embodiments described herein relate generally to a semiconductor device.

BACKGROUND

Recently, a solid state drive (SSD) in which a large-capacity memory device such as a hard disk drive (HDD) is replaced with a flash memory is developed. In an SSD, for example, a ball-grid-array (BGA) type semiconductor package in which a system-in-package (SiP) type module or a semiconductor chip is sealed with a resin is mounted. In this semiconductor package, electro-static discharge (ESD) is likely to occur when a charged device comes into contact with metals.

DETAILED DESCRIPTION

Embodiments provide a semiconductor device having improved ESD robustness.

In general, according to one embodiment, there is provided a semiconductor device including an interface, which is connectable with a host, and a first ground layer, a surface-mounted component mounted on the mounting substrate, and a plurality of solder balls between the mounting substrate and the surface-mounted component. The surface-mounted component includes a semiconductor chip, a package substrate that is positioned between the semiconductor chip and the solder balls and includes a second ground layer, a sealing portion that covers the semiconductor chip, and has an opening, a first conductive portion on a top surface of the sealing portion, and a second conductive portion on a side surface of the opening and electrically connected to the first conductive portion and the second ground layer. The second ground layer is electrically connected to the first ground layer through one of the solder balls.

Hereinafter, embodiments will be described with reference to the drawings. In the following description, the same components will be represented by the same reference numerals, and description of components described once will not be repeated as appropriate.

The drawings are schematic or conceptual, in which a relationship between the thickness and the width of each component, a ratio between the sizes of components, and the like are not necessarily the same as the actual ones. In addition, in a case where the same component is illustrated in different drawings, a dimension or a ratio of the component may vary depending on the drawings.

First Embodiment

Figure 1A:
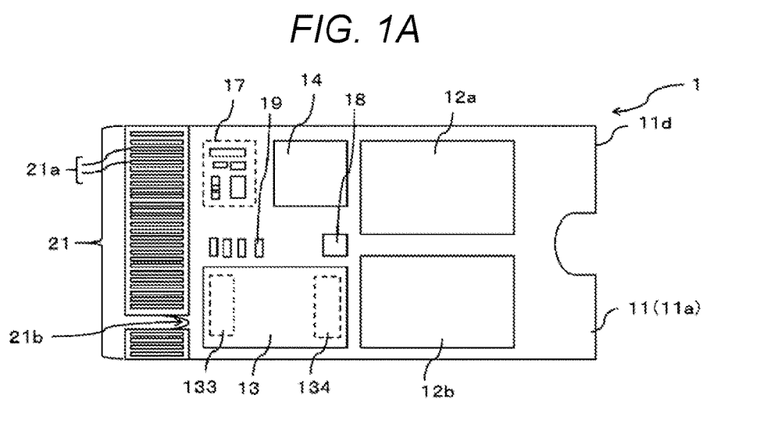
FIG. 1A is a top view illustrating an external appearance of a semiconductor device according to a first embodiment.
Figure 1B:
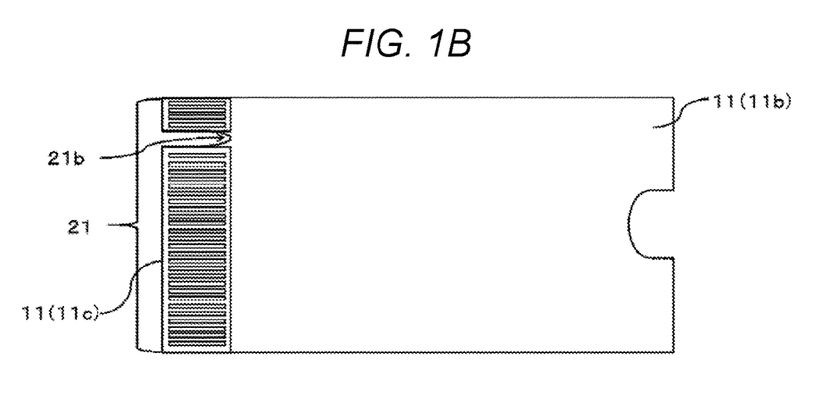
FIG. 1B is a bottom view illustrating the external appearance of the semiconductor device according to the first embodiment.
Figure 1C:
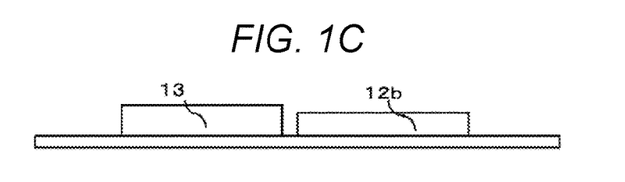
FIG. 1C is a side view illustrating the external appearance of the semiconductor device according to the first embodiment.
Figure 2:
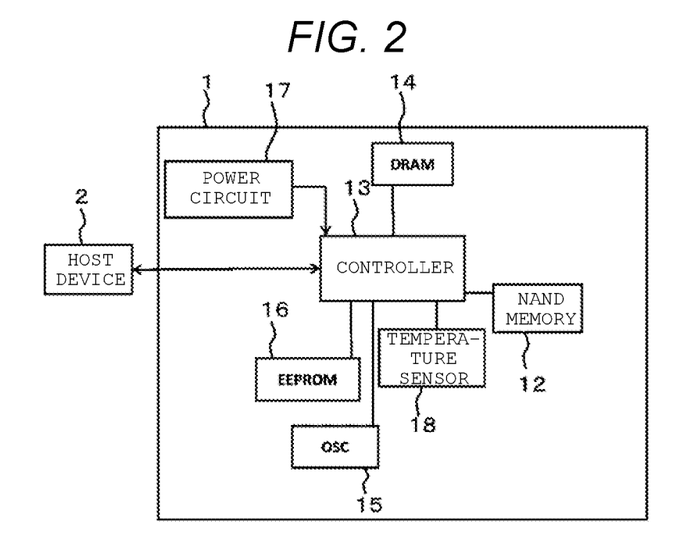
FIG. 2 is a diagram illustrating an example of a system configuration of the semiconductor device according to the first embodiment.

A first embodiment of the present disclosure will be described using FIGS. 1A to 5B. FIGS. 1A to 1C illustrate an external appearance of a semiconductor device 1 according to the first embodiment. FIG. 1A is a top view, FIG. 1B is a bottom view, and FIG. 1C is a side view. In addition, FIG. 2 illustrates an example of a system configuration of the semiconductor device 1 according to the first embodiment. As illustrated in FIG. 2, the semiconductor device 1 is connected to a host device 2. The host device 2 is, for example, a portable computer.

As illustrated in FIGS. 1A to 1C, the semiconductor device 1 includes a mounting substrate 11, a NAND flash memory (hereinafter, abbreviated as "NAND memory") 12 as a nonvolatile semiconductor memory element, a controller 13, a dynamic random access memory (DRAM) 14 as a volatile semiconductor memory element which can store data with a higher speed than that of the NAND memory 12, an oscillator (OSC) 15, an electrically erasable and programmable ROM (EEPROM) 16, a power circuit 17, a temperature sensor 18, and other electronic components 19 such as a resistor or a capacitor.

The NAND memory 12 or the controller 13 according to the first embodiment is mounted as part of a semiconductor package that is an electronic component. For example, the semiconductor package as the NAND memory 12 is a system-in-package type module, and a plurality of semiconductor chips is sealed in this single semiconductor package. The controller 13 controls an operation of the NAND memory 12.

The mounting substrate 11 is, for example, a substantially rectangular wiring board formed of a material such as a glass epoxy resin, and defines external dimensions of the semiconductor device 1. The mounting substrate 11 includes a first surface 11a, and a second surface 11b that is positioned opposite to the first surface 11a. In this specification, among the surfaces constituting the mounting substrate 11, a surface other than the first surface 11a and the second surface 11b is defined as "side surface" of the mounting substrate 11.

In the semiconductor device 1, the first surface 11a is a component mounting surface on which the NAND memory 12, the controller 13, the DRAM 14, the oscillator 15, the EEPROM 16, the power circuit 17, the temperature sensor 18, and the other electronic components 19 such as a resistor or a capacitor are mounted.

On the other hand, the second surface 11b of the mounting substrate 11 according to the embodiment is a component non-mounting surface on which the components are not mounted. This way, a plurality of components, which are formed separately from the mounting substrate 11, is disposed on one surface of the mounting substrate 11. As a result, the components can be made to protrude from only one surface of the mounting substrate 11. Thus, the thickness of the semiconductor device 1 can be reduced, as compared to a case where the components protrude from both the first surface 11a and the second surface 11b of the mounting substrate 11.

As illustrated in FIGS. 1A to 1C, the mounting substrate 11 includes a first edge portion 11c, and a second edge portion 11d that is positioned opposite to the first edge portion 11c. The first edge portion 11c includes an interface portion 21 (a substrate interface portion, a terminal portion, and a connection portion). The interface portion 21 is not necessarily provided on the mounting substrate 11 and may be realized using a connector component. Here, even when the connector component is used, the configuration is regarded as the interface portion 21.

The interface portion 21 includes, for example, a plurality of connection terminals 21a. The interface portion 21 is electrically connected to the host device 2, for example, by being inserted into a connector (not illustrated) of the host device 2. The interface portion 21 exchanges signals (e.g., a control signal and a data signal) with the host device 2.

The interface portion 21 according to the embodiment is, for example, an interface conforming to the standard of PCI Express (hereinafter, PCIe). That is, high-speed signals (high-speed differential signal) conforming to the standard of PCIe flow between the interface portion 21 and the host device 2. The semiconductor device 1 receives the supply of power from the host device 2 via the interface portion 21.

In the interface portion 21 according to the embodiment, an interface conforming to another standard such as serial attached SCSI (SAS), serial advanced technology attachment (SATA), nonvolatile memory express (NVMe), or universal serial bus (USB) may be used instead of the interface conforming to the standard of PCIe.

In the interface portion 21, a slit 21b is formed at a position, which is offset from the center position of the mounting substrate 11 in a transverse direction, so as to be fitted to a protrusion portion or the like provided in a connector of the host device 2. As a result, reverse attachment of the semiconductor device 1 can be prevented.

The power circuit 17 is, for example, a DC-DC converter and generates a predetermined voltage, which is required for the semiconductor package or the like, from the power supplied from the host device 2.

The controller 13 controls an operation of the NAND memory 12. That is, the controller 13 controls writing, reading, and erasing of data on the NAND memory 12.

The DRAM 14 is an example of a volatile memory and is used, for example, for storing management information used in managing the NAND memory 12 or for caching data. As the DRAM 14, for example, another volatile memory such as SRAM may also be used.

The oscillator 15 supplies operation signals having a predetermined frequency to the controller 13. The EEPROM 16 stores a control program or the like as fixed information.

The temperature sensor 18 detects a temperature of the semiconductor device 1 and notifies the detected temperature to the controller 13. In the embodiment, one temperature sensor 18 is mounted on the mounting substrate 11, and the temperature of the semiconductor device 1 is monitored by the temperature sensor 18. The number of temperature sensors 18 is not necessarily one. For example, a plurality of temperature sensors 18 may be provided on the mounting substrate 11 so as to monitor temperatures of the semiconductor device 1 at a plurality of positions.

On the mounting substrate 11 according to the embodiment, plural kinds of electronic components including the NAND memory 12, the controller 13, and the DRAM 14 are mounted. The temperatures of the electronic components vary depending on the operating state of the semiconductor device 1, loads applied to the respective electronic components, or the like. Therefore, to be exact, the temperature of the semiconductor device 1 is not uniform.

Therefore, in the embodiment, "the temperature of the semiconductor device 1" is defined as a temperature measured at a position where the temperature sensor 18 is mounted. In other words, "the temperature of the semiconductor device 1" described in the embodiment refers to the peripheral temperature of the position where the temperature sensor 18 is mounted.

Further, the temperature sensor 18 is not necessarily provided on the mounting substrate 11 and may be provided as one of the functions of the controller 13.

In addition, the temperature sensor 18 may be mounted inside the semiconductor package such as the NAND memory 12 or the controller 13, or may be bonded onto a surface of the semiconductor package. In this case, the temperature sensor 18 can measure the temperature of the NAND memory 12 or the temperature of the controller 13 with higher accuracy than a case where the temperature sensor 18 is mounted on the mounting substrate 11.

In this embodiment, the number of NAND memories 12, the mounting position thereof, and the like are not particularly limited to the example illustrated in the drawings. For example, in the embodiment, an example where two NAND memories 12 (12a and 12b) are mounted on the first surface 11a of the mounting substrate 11 is described. However, for example, the number of NAND memories 12 is not limited to this example.

Figure 3:
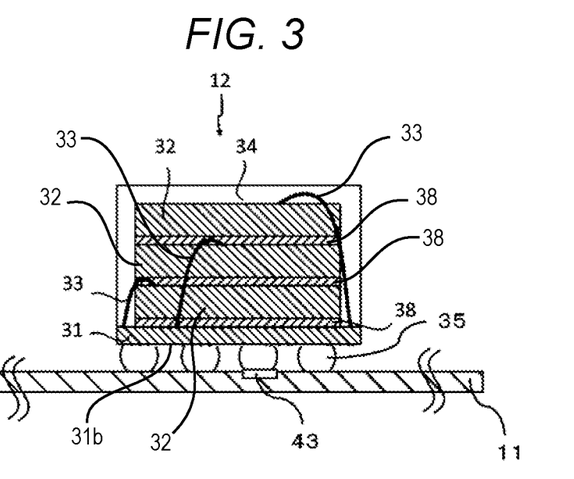
FIG. 3 is a cross-sectional view illustrating the semiconductor device according to the first embodiment in which a NAND memory is mounted.

FIG. 3 illustrates a cross-section illustrating the semiconductor package as the NAND memory 12 according to the embodiment. The NAND memory 12 includes a package substrate 31, a plurality of memory chips 32, bonding wires 33, a sealing portion (which is made of molding material) 34, and a plurality of solder balls 35.

The mounting substrate 11 is, for example, a multi-layer wiring board as described above, and FIG. 3 illustrates a part of a first GND layer 43. However, the mounting substrate 11 further includes a power supply layer, a GND layer, and an internal wiring, which are not illustrated in FIG. 3, and electrically connects the memory chips 32 to each other via the bonding wires 33 and the solder balls 35. The first GND layer 43 is an example of a GND layer of the mounting substrate 11 and is not necessarily provided at a position illustrated in FIG. 3.

As illustrated in FIG. 3, the solder balls 35 are provided on the package substrate 31. For example, the solder balls 35 are disposed in a lattice shape on a second surface 31b of the package substrate 31. The solder balls 35 are not necessarily disposed on the entire area of the second surface 31b of the package substrate 31, and may be disposed on a part of the second surface 31b.

In addition, the fixing between the package substrate 31 and the memory chips 32 or the fixing between the respective memory chips 32 is performed using mount films 38.

The memory chips 32 may be mounted after bonding the mount film 38 alone to the package substrate 31. In addition, for example, the mount film 38 may be used in the form of a single chip by bonding the mount film 38 to a wafer, which is used for the memory chips 32, and dicing the wafer.

Figure 4:
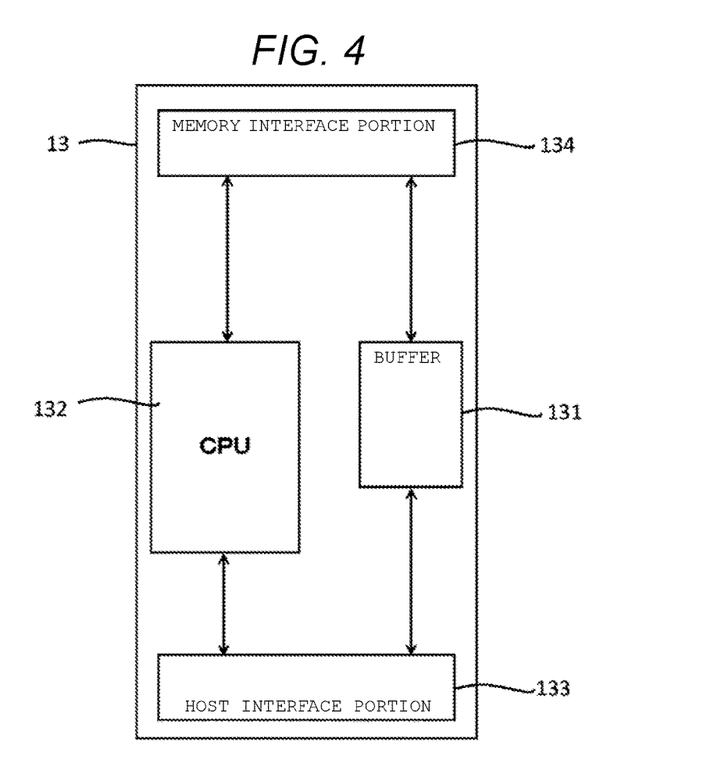
FIG. 4 is a diagram illustrating an example of a system configuration of a controller of the semiconductor device according to the first embodiment.

FIG. 4 illustrates an example of a system configuration of the controller 13. As illustrated in FIG. 4, the controller 13 includes, for example, a buffer 131, a central processing unit (CPU) 132, a host interface portion 133, and a memory interface portion 134.

As described above, the controller 13 may, for example, function as the temperature sensor 18 or a function as the power circuit 17, and the system configuration of the controller 13 is not limited to the configuration illustrated in the FIG. 4.

When data sent from the host device 2 is written on the NAND memory 12, the buffer 131 temporarily stores a predetermined amount of data. In addition, when data read from the NAND memory 12 is sent to the host device 2, the buffer 131 temporarily stores a predetermined amount of data.

The CPU 132 performs the overall control of the semiconductor device 1. The CPU 132 receives a write command, a read command, or an erase command from, for example, the host device 2 so as to perform an access to the corresponding region of the NAND memory 12 or to control data transfer processing through the buffer 131.

The memory interface portion 134 is interposed between the interface portion 21 of the mounting substrate 11, and the CPU 132 and the buffer 131. The host interface portion 133 performs interface processing between the controller 13 and the host device 2. For example, high-speed signals conforming to PCIe flow between the host interface portion 133 and the host device 2.

For example, in a case where a command is sent from the host device 2, the interface portion 21 receives signals corresponding to the command from the host device 2, and exchanges signals with the host interface portion 133 of the controller 13 via a wiring pattern of the mounting substrate 11 and a first solder portion.

As shown in FIGS. 1 and 4, the memory interface portion 134 is positioned between the NAND memory 12, and the CPU 132 and the buffer 131. The memory interface portion 134 performs interface processing between the controller 13 and the NAND memory 12.

Signals from the controller 13 are sent from the memory interface portion 134 to the wiring pattern of the mounting substrate 11 via the solder balls 35, and then are sent from the solder balls 35 to the NAND memory 12. Accordingly, the memory interface portion 134 is positioned between the NAND memory 12, and the CPU 132 and the buffer 131. As a result, the length of the wiring between the memory interface portion 134 and the NAND memory 12 can be reduced, and the operational stability of the semiconductor device 1 can be improved.

Figure 5A:
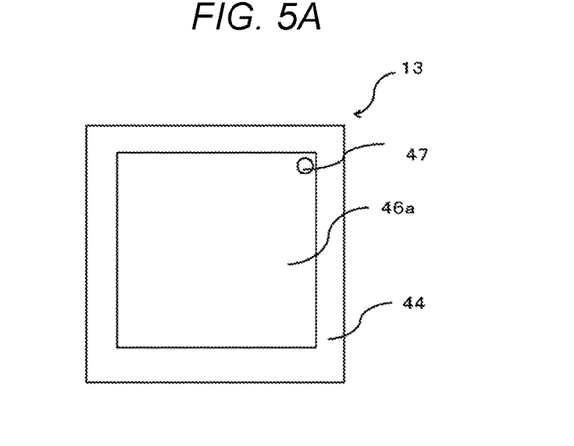
FIG. 5A is a top view illustrating the controller of the semiconductor device according to the first embodiment.
Figure 5B:
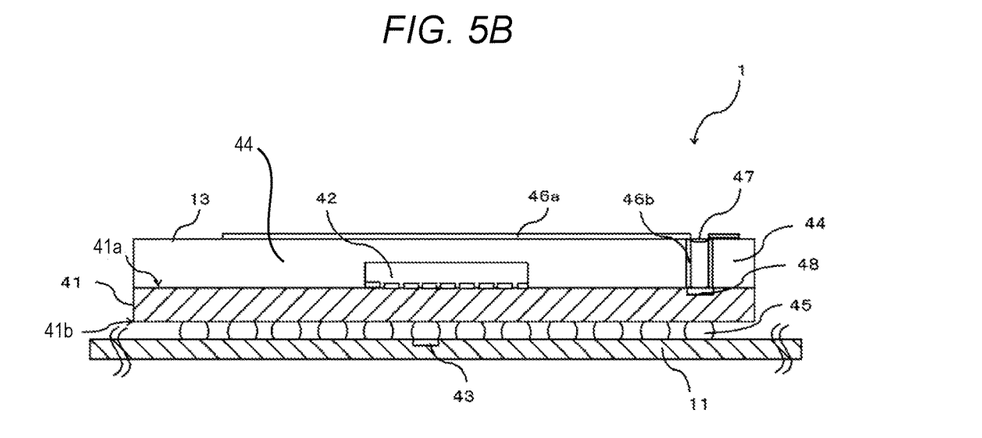
FIG. 5B is a cross-sectional view illustrating the semiconductor device according to the first embodiment in which the controller is mounted.

FIG. 5A is a top view of the controller 13 of the semiconductor device 1 according to the first embodiment. For convenience of description, the mounting substrate 11 is not illustrated in FIG. 5A. In addition, FIG. 5B is a cross-sectional view illustrating the semiconductor device 1 according to the first embodiment in which the controller 13 is mounted on the mounting substrate 11. As illustrated in FIG. 5B, the controller 13 includes a package substrate 41, a controller chip 42, a sealing portion (which is made of molding material) 44, a plurality of solder balls 45, a conductive film 46a, and a conductive film 46b. The mounting substrate 41 is, for example, a multi-layer wiring board as described above. The mounting substrate 11 includes a power supply layer, a ground (GND) layer, and an internal wiring, which are not illustrated in FIG. 5B, and is electrically connected to the controller 13 via the solder balls 45. For convenience of description, FIG. 5B illustrates a part of a second GND layer 48. However, this configuration is merely exemplary, and the present disclosure is not limited thereto. In addition, a conductive element such as an electrode pad for making electrical connection may be interposed between the solder balls 45 and the mounting substrate 11. Here, even in this case, the conductive element is regarded as a part of the substrate.

The package substrate 41 has a front surface 41a and a rear surface 41b. In the controller 13 according to the embodiment, the controller chip 42 and the sealing portion 44 are provided on the front surface 41a of the package substrate 41. In addition, the solder balls 45 are positioned on the rear surface 41b of the package substrate 41.

The controller chip 42 is covered with the sealing portion 44. The sealing portion 44 has an opening 47. The conductive film 46a is provided on a top surface of the sealing portion 44, and the conductive film 46b is provided along a side surface of the inside of the opening 47. The conductive film 46b is connected to the GND potential (in particular, the second GND layer 48) of the package substrate 41. In addition, the conductive film 46a provided on the top surface of the sealing portion 44 does not necessarily cover the entire area of the top surface of the sealing portion 44 and may cover a part of the top surface of the sealing portion 44.

Further, the conductive film 46a and the conductive film 46b are formed by sputtering or vapor deposition. The conductive film 46a and the conductive film 46b do not have to be thick as long as charges stored in the sealing portion 44 can be released. It is necessary that laser mark printing be performed on the top surface of the sealing portion 44.

As in the case of the conductive film 46a, the conductive film 46b does not necessarily cover the entire area of the side surface of the inside of the opening 47 and may cover a part of the side surface of the inside of the opening 47. In addition, the inside of the opening 47 surrounded by the conductive film 46b may be hollow, or a conductor may be inserted thereinto. Here, the conductive film 46a and the conductive film 46b are regarded as the separate films which are electrically connected to each other. However, the conductive film 46a and the conductive film 46b may be integrally formed.

A material of the conductive film 46 is, for example, metal which includes at least one selected from the group consisting of aluminum (Al), titanium (Ti), nickel (Ni), tungsten (W), gold (Au), zinc (Zn), and copper (Cu).

<Operation and Effects>

Here, the operation and effects of the semiconductor device 1 according to the first embodiment will be described. The description is focused on the controller 13, and specific examples will be described.

Electro-static discharge (ESD) occurs by a discharge current flowing through the inside of a semiconductor module. The semiconductor module may be damaged by ESD which occurs due to local heat generation or electric field concentration. ESD occurs due to some occurrence factors. In addition, there are test models for the occurrence factors of ESD, and test methods which are currently used are briefly classified into three models: human body model (HBM), machine model (MM), and charged device model (CDM).

Along with automation of module assembly processes, a device undergoes friction or electrostatic induction in automatic equipment, and there are increased opportunities for contact between the device and metals. Therefore, along with automation of module assembly processes, ESD caused by CDM, which occurs when a charged device comes into contact with metals, tends to increase.

Currently, an increase in SSD speed is in demand. To that end, there are many attempts to increase the operation speed of a controller. In a controller, the capacitance of a capacitor is reduced as much as possible for high-speed processing. As a result, the impedance of a controller is reduced and thus a high-speed operation is realized. On the other hand, a NAND memory can be speeded up by reducing the capacitance of a capacitor but may read the electrical charge of the capacitor incorrectly. Therefore, the capacity of a capacitor in a controller is smaller than that in a NAND memory, and a controller requires higher ESD robustness than NAND memory.

In most controllers, a sealing portion is formed of a resin. A main function of the sealing portion is protection from an external environment. However, since a target to be sealed with a resin is a semiconductor, an insulator is used as the resin. An insulator is electrostatically induced by an electrostatically charged object. The sealing portion is an insulator and thus is likely to be charged. Therefore, by grounding a conductive portion, which is exposed to the outside of a package, to GND, charged particles are likely to be released to the air by self discharge (thereby achieving CDM robustness). In addition, charges of ESD surges caused by external contact (or in the air) can be prevented from flowing to an important controller in a sealing portion (thereby achieving HBM robustness, MM robustness).

Here, as illustrated in FIG. 5B, the controller chip 42 is covered with the sealing portion 44. The conductive film 46a is formed on the top surface of the sealing portion 44. Charges in the sealing portion 44 are released through the conductive film 46a by self discharge. As a result, ESD surges caused by CDM can be reduced in the semiconductor device 1 according to the first embodiment. In addition, charges of ESD caused by contact with an external highly charged object (or in the air) flow to the conductive film 46a and the conductive film 46b connected to the GND potential. As a result, the controller 13 can be made robust to ESD caused by HBM or MM. With the above-described configuration, the influence of ESD on the controller chip 42 in the semiconductor device 1 can be reduced.

In the description of the embodiment, the embodiment is applied to the controller 13 as an example. However, the embodiment is applicable not only to the controller 13 but also to a surface mounting type semiconductor package component, such as the NAND memory 12 illustrated in FIG. 3, to which a mounting substrate and a package substrate are connected.

Figure 6A:
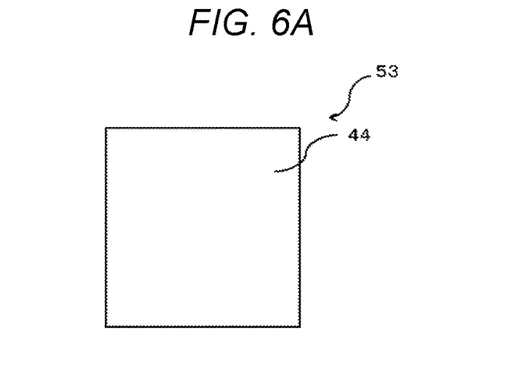
FIG. 6A is a top view illustrating a controller of a semiconductor device according to a first comparative example.

Next, a semiconductor device 3 according to a comparative example will be described with reference to FIGS. 6A and 6B.

A controller 53 mounted in the semiconductor device 3 includes the package substrate 41, the controller chip 42, the sealing portion 44, and the solder balls 45. FIG. 6A is a top view illustrating the controller 53 of the semiconductor device 3 according to the comparative example. For convenience of description, the mounting substrate 11 is not illustrated in FIG. 6A.

Figure 6B:
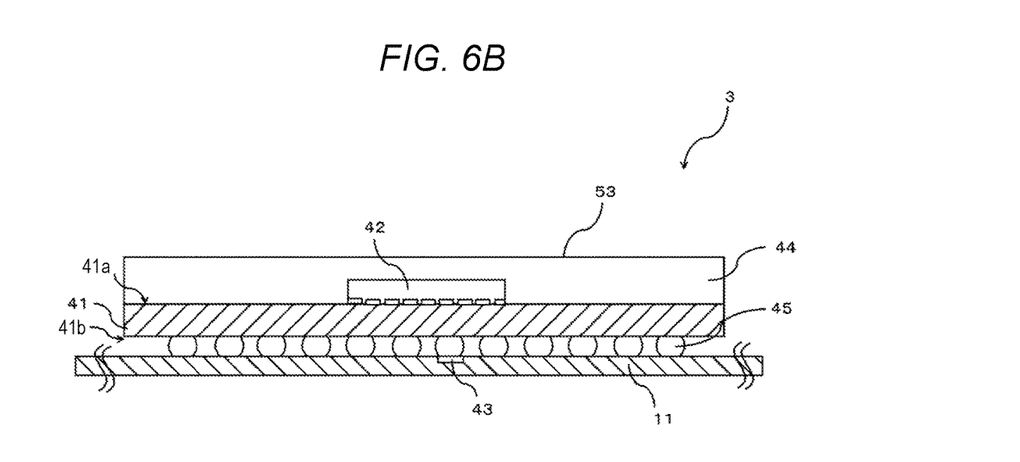
FIG. 6B is a cross-sectional view illustrating the semiconductor device according to the first comparative example in which the controller is mounted.

As illustrated in FIG. 6B, the solder balls 45 are provided below the package substrate 41. In addition, the controller chip 42 is provided above the package substrate 41, and the controller chip 42 is surrounded by the sealing portion 44.

The sealing portion 44 is an insulator and thus is likely to be electrostatically induced and charged by an electrostatically charged object. In addition, the sealing portion 44 does not have a path for releasing charges. Therefore, in the sealing portion 44, ESD is likely to occur due to charges generated by contact with external metals. As a result, problems such as malfunction or damages of the controller chip 42 may occur.

On the other hand, in the semiconductor device 1 according to the first embodiment, by connecting the conductive film 46a, which is exposed to the outside of the sealing portion 44, to GND, charged particles in the sealing portion 44 are likely to be released to the air by self discharge. As a result, when ESD occurs, damages of the controller chip 42 can be reduced.

In addition, charges of ESD surges caused by external contact (or in the air) can be prevented from flowing to the controller chip 42 in the sealing portion, and the controller chip 42 can be protected. The conductive film 46a functions as a lightening rod, and the controller chip 42 can be prevented from being damaged by local heat generation or electric field concentration during the occurrence of ESD.

In addition, in the semiconductor device 1, it is not necessary to incorporate a circuit to protect against ESD, and so size increase is not a problem.

With the above-described configuration, the influence of ESD on the controller chip 42 in the semiconductor device 1 can be reduced.

First Modification Example of First Embodiment

Figure 7A:
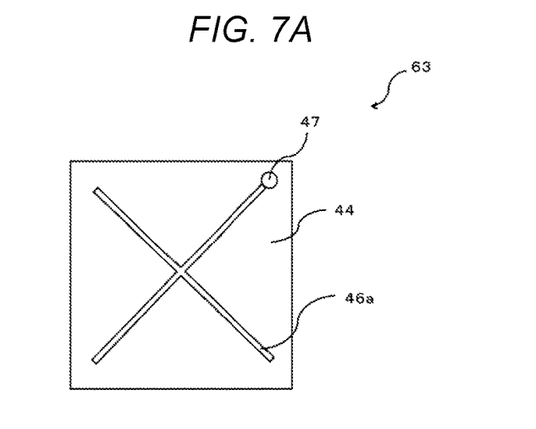
FIG. 7A is a top view illustrating a controller of a semiconductor device according to a first modification example of the first embodiment.
Figure 7B:
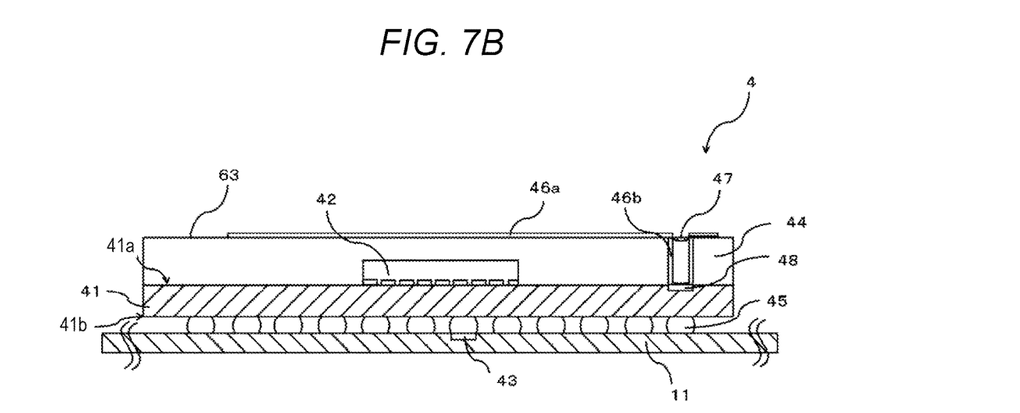
FIG. 7B is a cross-sectional view illustrating the semiconductor device according to the first modification example of the first embodiment in which the controller is mounted.

A difference from the first embodiment will be mainly described. In a controller 63 mounted in a semiconductor device 4 according to a modification example of the first embodiment, a conductive line is provided on the top surface of the sealing portion 44 instead of the conductive film. FIG. 7A is a top view illustrating the controller 63 of the semiconductor device 4 according to the first modification example of the first embodiment. FIG. 7B is a cross-sectional view illustrating the semiconductor device according to the first modification example of the first embodiment in which the controller is mounted. For convenience of description, the mounting substrate 11 is not illustrated. A conductive line 46a is provided along the top surface of the sealing portion 44. A conductive line 46b is provided along the side surface of inside of the opening 47. FIGS. 7A and 7B illustrate an example in which the conductive line 46a and the conductive line 46b interconnect with each other. However, one conductive line 46a or a plurality of conductive lines 46a may be provided. In either case, the conductive line 46b is connected to the GND potential of the package substrate 41 through the opening 47.

As illustrated in FIG. 7B, the solder balls 45 are provided on the rear surface 41b of the package substrate 41.

The preparation method and effects of the semiconductor device 4 are the same as those of the semiconductor device 1 according to the first embodiment, but the area of a region of the top surface of the sealing portion 44 where the conductive line is not provided is large. Therefore, laser mark printing is easily performed on the sealing portion 44.

In addition, since the conductive film is not used, the costs for forming conductive layer on the sealing portion 44 can be reduced.

Second Embodiment

Figure 8A:
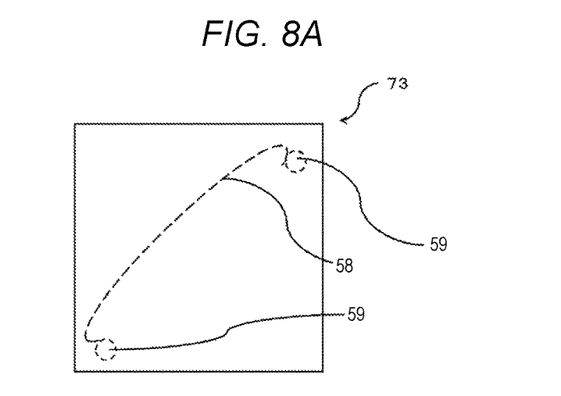
FIG. 8A is a top-view of a controller of a semiconductor device according to a second embodiment.
Figure 8B:
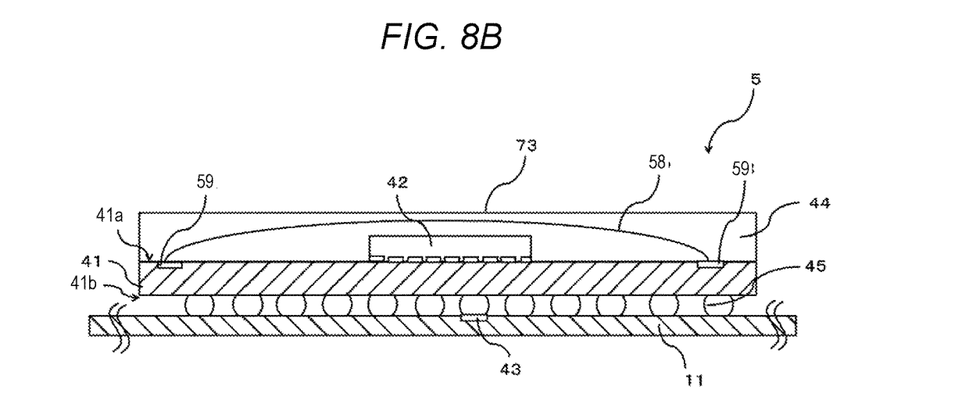
FIG. 8B is a cross-sectional view illustrating the semiconductor device according to the second embodiment in which the controller is mounted.

A difference from the first embodiment will be mainly described. As illustrated in FIGS. 8A and 8B, in a controller 73 mounted in a semiconductor device 5 according to a second embodiment, an internal wire 58 is disposed in the sealing portion 44 so as to pass through a region above the controller chip 42 without contact with the controller chip 42. In addition, the second embodiment is different from the first embodiment, in that a conductive film and a conductive line are not provided on the top surface of the sealing portion 44.

FIG. 8A is a top view illustrating the controller 73 of the semiconductor device 5 according to the second embodiment. For convenience of description, the mounting substrate 11 is not illustrated. FIG. 8A illustrates the internal wire 58 connected to a second GND layer 59.

As in the case of the controller 63 mounted in the semiconductor device 4, laser mark printing is easily performed on the sealing portion 44. However, unlike the first embodiment, the internal wire 58 connected to GND is not exposed to the outside of the sealing portion 44. Therefore, the amount of charges released by self discharge (electric leakage) is reduced. Thus, the effect of improving robustness to ESD caused by CDM is reduced. On the other hand, the conductive internal wire 58 which is provided in the sealing portion 44 is disposed to pass through the top surface of the controller chip 42 as a core. Therefore, in the controller 63, charges which cause ESD can be released through another path (not including the controller chip 42). As a result, the influence of ESD on the controller chip 42 can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a mounting substrate including an interface, which is connectable with a host, and a first ground layer;
a surface-mounted component mounted on the mounting substrate; and
a plurality of solder balls between the mounting substrate and the surface-mounted component,
wherein the surface-mounted component includes
a semiconductor chip,
a package substrate that is positioned between the semiconductor chip and the solder balls and includes a second ground layer,
a sealing portion that covers the semiconductor chip, and has an opening,
a first conductive film formed on a top surface of the sealing portion, and
a second conductive film formed on a side surface inside the opening and electrically connected to the first conductive film and the second ground layer, and wherein the second ground layer is electrically connected to the first ground layer through at least one the solder balls.

2. The semiconductor device according to claim 1, wherein the first conductive film and the second conductive film are integrally formed.

3. The semiconductor device according to claim 1, wherein the first conductive film includes a conductive line that covers a part of the top surface of the sealing portion.

4. The semiconductor device according to claim 3, wherein the second conductive film covers a part of the side surface of the opening.

5. The semiconductor device according to claim 3, wherein the second conductive film covers the side surface of the opening entirely.

6. The semiconductor device according to claim 1, wherein the first conductive film includes two conductive lines that intersect, one of the two conductive lines contacting the second conductive film.

7. The semiconductor device according to claim 1, wherein the first conductive film covers an entire area of the top surface of the sealing portion that is directly above the semiconductor chip.

8. The semiconductor device according to claim 7, wherein the second conductive film covers a part of the side surface of the opening.

9. The semiconductor device according to claim 7, wherein the second conductive film covers the side surface of the opening entirely.

10. The semiconductor device according to claim 1, wherein the semiconductor chip is a controller for a non-volatile semiconductor memory chip.

11. A semiconductor device comprising:
a mounting substrate including an interface, which is connectable with a host, and a first ground layer;
a surface-mounted component mounted on the mounting substrate; and
a plurality of solder balls between the mounting substrate and the surface-mounted component,
wherein the surface-mounted component includes
a semiconductor chip,
a package substrate that is positioned between the semiconductor chip and the solder balls and includes a second ground layer,
a sealing portion that covers the semiconductor chip, and has an opening, and
an internal wire that is disposed within the sealing portion so as to pass through a region above the semiconductor chip and is electrically connected to two contacts of the second ground layer.

12. The semiconductor device according to claim 11, wherein the internal wire is not in contact with the surface-mounted component.

13. The semiconductor device according to claim 11, wherein the second ground layer is electrically connected to the first ground layer through at least one of the solder balls.

14. The semiconductor device according to claim 11, wherein the semiconductor chip is a controller for a non-volatile semiconductor memory chip.

15. A semiconductor device comprising:
a mounting substrate including an interface, which is connectable with a host, and a first ground layer;
a first package including a non-volatile semiconductor memory chip, mounted on the mounting substrate;

a second package including a controller for the nonvolatile semiconductor memory, mounted on the mounting substrate; and a plurality of solder balls between the mounting substrate and each of the first and second packages, wherein the second package includes a semiconductor chip, a package substrate on which the semiconductor chip is mounted, a second ground layer, a sealing portion that covers the semiconductor chip, the sealing portion having an opening, a first conductive film formed on a top surface of the sealing portion, and a second conductive film formed on a side surface inside the opening and electrically connected to the first conductive film and the second ground layer, and wherein the second ground layer is electrically connected to the first ground layer through at least one the solder balls that are between the second package and the mounting substrate.

16. The semiconductor device according to claim 15, wherein the first conductive film and the second conductive film are integrally formed.

17. The semiconductor device according to claim 15, wherein the first conductive film includes a conductive line that covers a part of the top surface of the sealing portion.

18. The semiconductor device according to claim 15, wherein the first conductive film includes two conductive lines that intersect, one of the two conductive lines contacting the second conductive film.

19. The semiconductor device according to claim 15, wherein the first conductive film has a planar shape and covers an entire area of the top surface of the sealing portion that is directly above the semiconductor chip, and the second conductive film covers a part of the side surface of the opening.

20. The semiconductor device according to claim 15, wherein the first conductive film covers an entire area of the top surface of the sealing portion that is directly above the semiconductor chip, and the second conductive film covers the side surface of the opening entirely.

* * * * *